United States Patent [19]

Speckman et al.

[11] Patent Number: 4,935,381
[45] Date of Patent: Jun. 19, 1990

[54] PROCESS FOR GROWING GAAS EPITAXIAL LAYERS

[75] Inventors: Donna M. Speckman, Los Angeles; Jerry P. Wendt, Arcadia, both of Calif.

[73] Assignee: The Aerospace Corporation, El Segundo, Calif.

[21] Appl. No.: 282,408

[22] Filed: Dec. 9, 1988

[51] Int. Cl.$^5$ .............................................. H01L 21/20
[52] U.S. Cl. .............................. 437/81; 148/DIG. 41; 148/DIG. 65; 148/DIG. 110; 156/613; 437/96; 437/107; 437/971
[58] Field of Search .................... 148/DIG. 22, 41, 56, 148/65, 79, 97, 110, 119, 130, 127, 169; 156/610-615; 427/248.1, 252, 255.1; 437/81, 87, 95, 96, 105, 107, 949, 971

[56] References Cited

U.S. PATENT DOCUMENTS

| | | | |
|---|---|---|---|
| 4,340,617 | 7/1982 | Deutsch et al. | 427/53.1 |
| 4,524,090 | 6/1985 | Bottka | 437/234 |
| 4,626,448 | 12/1986 | Hays | 427/39 |
| 4,792,467 | 12/1988 | Melas et al. | 427/255 |
| 4,814,203 | 3/1989 | DePriest | 427/248.1 |

OTHER PUBLICATIONS

Speckman et al., "Triethylarsenic and Arsine as Co-Reagents...", J. Crys. Growth, vol. 93, 1988, pp. 29-33.

Blaau W. et al., "Metalorganic Chemical-Vapour-Deposition Growth and Characterization of GaAs", Can. J. Phys., vol. 63, 1985, pp. 664-669.

Tromson et al., "Metal Organics Vapour Phase Epitaxy of GaAs...", Rev. Phys. Appl., vol. 20, No. 8, Aug. 1985, pp. 569-574.

Speckman et al., "Alternatives to Arsine...Growth of GaAs Using Triethylarsenic", Appl. Phys. Lett., vol. 50, No. 11, Mar. 16, 1987, pp. 676-678.

Lum et al., "Investigation of Triethylarsenic as a Replacement for Arsine...", Appl. Phys. Lett., vol. 52, No. 18, May 2, 1988, pp. 1475-1477.

Primary Examiner—Brian E. Hearn
Assistant Examiner—William Bunch
Attorney, Agent, or Firm—William J. Burke

[57] ABSTRACT

Disclosed is a novel method to use arsine plus an alkylarsenic co-reagent to grow GaAs by OMCVD that not only allows one to take advantage of the lower toxicity and ease of decomposition of the alkylarsenic compounds, but also reduces the carbon contamination normally found in epilayers grown exclusively from these alkylarsines, and decreases the amount of arsine needed for growth of reasonably good quality GaAs epilayers.

2 Claims, No Drawings

PROCESS FOR GROWING GAAS EPITAXIAL LAYERS

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

The invention relates generally to methods of growing high quality gallium arsenide (GaAs) epitaxial layers by organo metallic chemical vapor deposition (OMCVD) and, in particular, to the methods which take place under less hazardous conditions than are currently employed for this technology.

2. Description of the Prior Art

The OMCVD (organometallic chemical vapor deposition) of GaAs typically involves the pyrolysis of trimethylgallium and arsine which are flowed over a GaAs substrate wafer which is/has been heated to 600°–850° C. in a reactor. The gases begin to decompose as they enter the heated region above the wafer, and crystalline GaAs is deposited via a combination of gas phase and surface reactions.

Due to differences in reactivity, the molar ratio of arsine to trimethylgallium (the "V/III" ratio) must be kept quite high in order to obtain n-type GaAs. Typically this "V/III" ratio is on the order of 20 or more. Also, growth temperatures must be maintained in the regime of 600°–850° C., with most growths carried out at 650°–700° C., since at temperatures below 600° C., the epilayer surfaces exhibit very poor morphology. For example, at temperatures below 600° C., the epilayer surfaces are coated with Ga-rich hillocks. These hillocks are undesirable because they alter the electrical properties of the surface, and the poor morphology can severely reduce device yield during processing.

Some alternative growth processes have also been reported recently. These involve the growth of GaAs by OMCVD using organoarsenic reagents in conjunction with trimethylgallium, without arsine. These organoarsenic compounds include tertiarybutylarsine (t-BuAsH$_2$), trimethylarsenic (Me$_3$As), diethylarsine (Et$_2$AsH), and triethylarsenic (Et$_3$As). Nearly all of these alternative arsenic reagents were found to produce n-type GaAs films at very low V/III molar ratios (<5), but these epilayers were generally found to be highly compensated, with the predominant p-type impurity being carbon (diethylarsine was found to produce some reasonable quality GaAs under certain conditions, however). The temperatures required for growth using these reagents were typically 550°–800° C.

There are several drawbacks to the use of arsine in the OMCVD growth of GaAs. The most significant problem is the safety risk associated with this material. Arsine gas is extremely toxic, with a lethal concentration of 3 ppm. In addition, arsine is stored in high pressure cylinders which poses a severe health threat should a leak or reactor damage occur. These combined dangers make it very difficult to get local building code approvals for the construction of OMCVD reactors in or near populated areas. Moreover, it is expensive to set up monitoring systems, scrubbers, emergency rescue gear, and related procedures for the handling of arsine.

A second important drawback is the need for high V/III ratios to produce n-type GaAs from arsine and trimethylgallium. These high ratios make this process wasteful, and also require that very large quantities of arsine be stored on site. A third major drawback is that growth temperatures are limited to >600° C. when using arsine, which may be unsuitable when attempting to grow GaAs on other substrate materials, such as phosphides, which may have problems with outgassing at these higher temperatures.

The main reasons for the interest in using alkylarsenic compounds are: (1) they generally eexhibit lower toxicities than arsine, and (2) less energy is required for their thermal decomposition when compared with arsine. This latter feature implies that lower growth temperatures could be used and that alkylarsines should react more efficiently with Me$_3$Ga such that a lower arsenic/gallium ratio would be required for GaAs growth. These alkylarsenic compounds have some significant disadvantages, however. For example, these substitutes generally do not produce high quality epilayers. The studies on GaAs growth using Et$_3$As/Me$_3$Ga have shown that the epilayers grown from these reagents alone are heavily contaminated with carbon ($10^{17}$–$10^{21}$ cm$^{-3}$). Carbon is also the only detectable impurity by SIMS analysis as reported in "Atmospheric Pressure OMCVD Growth of GaAs using Triethyl arsenic and Alkylgallium Precursors", Paper C4.9, Mat. Res. Soc. Fall Meeting, Boston, MA, 1987. This carbon contamination problem has also been observed in GaAs epilayers grown from several other alkylarsenic reagents. The unintentional carbon doping is apparently due to the inherent growth chemistry of the Et$_3$As/Me$_3$Ga reagent mixture, and might be attributed either to an incomplete decomposition of Et$_3$As such that arsenic-alkyl bonds are not entirely cleaved and a certain number of ethyl groups are incorporated into the growing GaAs film, or to the formation of large quantities of alkyl radicals in the gas phase, which can react with the substrate surface, and thus become incorporated into the epilayer.

These mechanisms would indicate that without arsine there is no method by which surface-bound alkyl groups could be removed. Most of the alternative organoarsenic compounds also produce GaAs epilayers with poor surface morphologies. Thus, there is a strong need to be able to improve the quality of GaAs epitaxial layers grown by OMCVD from these less hazardous organoarsenic materials.

It is therefore an object of the present invention to develop a safer process for growing GaAs. It is yet another object of the invention to greatly reduce the amount of arsine used in growing GaAs. It is still another object of the invention to develop a lower-temperature process for growing good quality GaAs epilayers with smooth, mirror-like surfaces. It is yet another object of the present invention to develop a process which reduces the contamination from carbon impurities which is characteristic of other contemporary processing.

SUMMARY OF THE INVENTION

A new process has been developed that has been found to reduce the quantity of arsine necessary for the growth of high quality GaAs by a factor of at least 50 percent. For the growth of lesser but adequate quality GaAs epilayers, the amount of arsine can be reduced by 85 percent or more. This reduction in the arsine requirement translates to a safer working environment and fewer problems with toxic waste disposal. The new process, which employs a low toxicity organoarsenic reagent in conjunction with arsine, also requires less total arsenic per mole of gallium reagent than conventional OMCVD to produce high quality GaAs, thus providing a more efficient overall growth process. Another advantage of the new process is that the growth temperatures typically used in the standard OMCVD growth of GaAs from arsine and Me$_3$Ga can be reduced from approximately 600°–850° C. to approximately 560°–580° C. This reduction in growth temperature may allow for the growth of alloys such as GaInAs on InP where a lower growth temperature reduces the overpressure of phosphorous needed to prevent substrate decomposition. Gallium arsenide epilayers grown using the new process also exhibit surfaces with slightly better morphologies than those grown by conventional OMCVD methods.

DETAILED DESCRIPTION OF THE PREFERRED EMBODIMENT

The new process involves the use of a trialkylarsenic species (R$_3$As) as a co-reagent with arsine and Me$_3$Ga for the growth of GaAs epilayers by OMCVD. These three reagents all react together in an OMCVD reactor via a novel in situ chemical reaction to produce high quality GaAs epilayers. This reagent combination reduces the molar ratio of arsenic/gallium (called V/III) from a typical range of 20–40 for standard OMCVD growth using arsine and Me$_3$Ga to a range of approximately 5–20 for the production of good quality epilayers grown from the alkylarsenic/arsine/Me$_3$Ga combination. Since only a portion of the arsenic used to grow these layers in the co-reagent process is arsine (generally 50 percent), the amount of arsine necessary to produce high quality GaAs is reduced by at least 50 percent. This reduction in required arsine, combined with the fact that the amount of total arsenic needed for growth can be reduced and that alkylarsenic compounds are significantly less toxic than arsine, results in a substantial improvement in the safety of the OMCVD process. Alkylarsines, which are typically high boiling liquids stored in stainless steel bubblers at atmospheric pressure, are also much safer to store and handle.

The novelty of this process is the use of alkyl- and hydride-arsenics as co-reagents in a method to alter the in situ OMCVD reaction chemistry and improve GaAs epilayer growth safety while maintaining growth quality. This approach has no precedence in GaAs OMCVD technology. To date, most of the emphasis on reducing the need for using arsine in the OMCVD growth of GaAs has centered around the substitution of alkylarsenic compounds for 100 percent of the arsine used for growth.

The viability of this process has been tested using triethylarsenic (Et$_3$As) as the trialkylarsenic source. A 1:1 molar ratio of Et$_3$As:arsine was employed for a series of growth experiments, which were carried out in a standard vertical, atmospheric pressure reactor. Gallium arsenide epilayers were grown at a variety of V/III ratios at several different temperatures. For example, V/III ratios ranged from about 3 to 45 and temperatures ranged from about 550° to 600° C. Epilayers were also grown using the arsine/Me$_3$Ga and Et$_3$As/Me$_3$Ga reagent combinations for comparison.

In one embodiment, the Et$_3$As/arsine/Me$_3$Ga reagent mixture produced good quality, n-type epilayers at 580° C. for V/III ratios of 5–10 using the co-reagent system. A good quality epilayer is characterized as one with mirror-like surfaces and with room temperatures and 77 K. mobilities greater than 6,000 and 30,000 cm$^2$/V-s, respectively. In contrast, the prior art shows that good quality GaAs could be obtained only where the V/III was greater than 20 for the arsine (Me$_3$Ga System). Moreover, the quality of the epilayers produced according to the present invention is significantly better than the quality of those produced using Et$_3$As/Me$_3$Ga.

The new process using a three-reagent system (triethylarsenic/arsine and Me$_3$Ga) thus has advantages over each of the two-reagent systems (arsine plus Me$_3$Ga or organoarsenics plus Me$_3$Ga) from which it is derived.

Compared with the growth of GaAs by arsine+Me$_3$Ga, the co-reagent process described is substantially safer. The amount of arsine required per growth experiment is greatly reduced, both due to a decrease in the V/III ratio required, and to the fact that only one half of the arsenic being used in growth is in the form of arsine. Thus, not only is less arsine being flowed through the reactor during growth experiments (which is desirable in case a leak or explosion occurs), but also less arsine is needed to be stored on site. For example, producing solar cells using prior art processes generally involves using a V/III ratio of about 20. If a 30 pound bottle of arsine is required each month, a 2-ton carbon scrubber would have to be replaced every six months. Using the present invention, the V/III ratio can be reduced to about 5 and a 30 pound bottle of arsine would last about eight months and the 2-ton carbon scrubber would last almost four years. As an added safety bonus, the triethylarsenic is significantly less toxic than arsine. It is anticipated that the LC$_{50}$ of triethylarsenic is similar to that of trimethylarsenic: approximately 20,000–22,000 ppm according to the Material Safety Data Sheet (MSDS) for trimethylarsenic. Also, it is stored at one atmosphere in a stainless steel bubbler, and it has a very low vapor pressure (15.5 mm at 37° C.). The co-reagent mixture is thus a safer alternative to the use of pure arsine. Another advantage to the use of the co-reagent system is that, besides reducing the required V/III ratio, it also lowers the growth temperature necessary to obtain good quality GaAs epilayers with mirror-like surfaces.

The use of arsine and triethylarsenic as co-reagents also reduces the carbon impurity contamination which is found in GaAs epilayers grown using Et$_3$As as the only arsenic source. This reduction in carbon is observed both in the photoluminescence spectra of samples grown from the two different methods, and also has been confirmed by secondary ion mass spectrometry (SIMS). As shown in Tables 1 and 2, in the co-reagent-grown films, the carbon content is close to or below the background carbon content of the substrate material ($<4\times10^{16}$ cm$^{-3}$), whereas GaAs grown from triethylarsenic contains carbon with concentrations greater than $10^{17}$ cm$^{-3}$.

TABLE 1

| V/III Ratio | Growth Temp. (°C.) | Carbon Concentration (cm$^{-3}$) | |
|---|---|---|---|
| | | Et$_3$As + AsH$_3$ + Me$_3$Ga (Et$_3$As/AsH$_3$ = 1) | Et$_3$As + Me$_3$Ga* |
| 5 | 580 | 9E16 | 5E17–1E21 |

TABLE 1-continued

| V/III Ratio | Growth Temp. (°C.) | Carbon Concentration (cm$^{-3}$) Et$_3$As + AsH$_3$ + Me$_3$Ga (Et$_3$As/AsH$_3$ = 1) | Et$_3$As + Me$_3$Ga* |
|---|---|---|---|
| 10 | 580 | 5E16 | 2E17-1E21 |
| 10 | 560 | 6.3E16 | 1E18-1E21 |
| 15 | 560 | 7.3E15 | |
| 18 | 560 | | 6E17-3E19 |
| 30 | 560 | 5.6E15 | |

TABLE 2

| V/III Ratio | Growth Temp. (°C.) | Carbon Concentration (cm$^{-3}$) Et$_3$As + AsH$_3$ + Me$_3$Ga | Et$_3$As/AsH$_3$ |
|---|---|---|---|
| 10 | 560 | 1E18-1E21* | |
| 10 | 560 | 6.7E15 | 3 |
| 10 | 560 | 7.9E15 | 2 |
| 10 | 560 | 6.3E15 | 1 |
| 10 | 560 | 6.2E15 | ½ |
| 10 | 560 | 8.9E15 | ⅓ |
| 10 | 560 | 5.5E15 | 0 |

*Carbon distribution very non-uniform within epilayers grown from Et$_3$As + Me$_3$Ga, with very high concentrations at the interface.

These data confirm that the three-reagent system is indeed a unique growth system, and not a product of the two independent growth pathways (AsH$_3$/Me$_3$Ga and Et$_3$As/Me$_3$Ga) from which it is derived. The growth process described in the patent application thus demonstrates a method of growth for GaAs epilayers that offers improvements over existing growth processes by improving safety while maintaining epilayer quality.

We claim:

1. A method of growing high quality galliuim arsenide (GaAs) epitaxial layers by organo metallic chemical vapor deposition (OMCVD), comprising the following steps:
   a. placing a GaAs substrate wafer in an OMCVD reactor;
   b. heating the wafer to a temperature of between 550°-600° C. in a carrier gas flow;
   c. injecting into the reactor, reagents consisting of a trialkylarsenic (R$_3$As) species, arsine and Me$_3$Ga, wherein the molar ratio of total arsenic to gallium is in the range between 5-45;
   d. whereby crystalline GaAs is deposited on the wafer in smooth layers;
   e. and wherein the decomposition of the arsine reagent is enhanced due to a chemical reaction with the trialkylarsenic reagent.

2. The method as claimed in claim 1 wherein the carrier gas is hydrogen.

* * * * *